United States Patent
Izumida

(10) Patent No.: US 7,535,064 B2
(45) Date of Patent: May 19, 2009

(54) SEMICONDUCTOR DEVICE HAVING A FIN AND METHOD OF MANUFACTURING THE SAME

(75) Inventor: Takashi Izumida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/401,928

(22) Filed: Apr. 12, 2006

(65) Prior Publication Data

US 2007/0170509 A1     Jul. 26, 2007

(30) Foreign Application Priority Data

Jan. 20, 2006    (JP)  .............................. 2006-012278

(51) Int. Cl.
*H01L 29/76*     (2006.01)
*H01L 29/94*     (2006.01)
*H01L 31/062*     (2006.01)
*H01L 31/113*     (2006.01)
*H01L 31/119*     (2006.01)

(52) U.S. Cl. ................. 257/368; 257/369; 257/E27.06; 257/27.062

(58) Field of Classification Search ................. 257/250, 257/331, 336, 347, 337–338, 368–369, E27.06, 257/E27.062
See application file for complete search history.

(56) References Cited

U.S. PATENT DOCUMENTS 5,315,143 A    5/1994   Tsuji 7,153,733 B2 * 12/2006 Seo et al. ................. 438/197
2004/0169269 A1 * 9/2004 Yeo et al. ................. 257/692

FOREIGN PATENT DOCUMENTS

| JP | 2-263473 | 10/1990 |
|---|---|---|
| JP | 2002-118255 | 4/2002 |
| JP | 2005197676 | 7/2005 |

OTHER PUBLICATIONS

Masaki Kondo, et al., "A FinFET Design Based on Three-Dimensional Process and Device Simulations", IEEE, 2003, pp. 179-182.

* cited by examiner

*Primary Examiner*—Hoai v Pham
(74) *Attorney, Agent, or Firm*—Oblon, Spivak, McClelland, Maier & Neustadt, P.C.

(57) ABSTRACT

A semiconductor device includes a Fin, a source region and a drain region, a first extension region, a second extension region and a channel region. The Fin is formed on a major surface of a semiconductor substrate. The source region and drain region are formed at both end portions of the Fin. The first extension region is formed between the source region and the drain region within the Fin in contact with the source region. The second extension region is formed between the source region and the drain region within the Fin in contact with the drain region. The channel region is located between the first extension region and the second extension region within the Fin, a height of the Fin of the channel region being greater than a height of the Fin of each of the first extension region and the second extension region.

9 Claims, 12 Drawing Sheets

(Plan view)

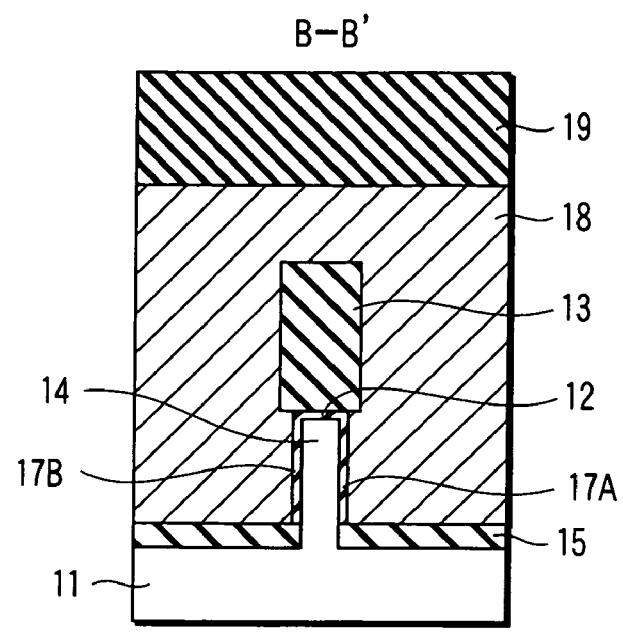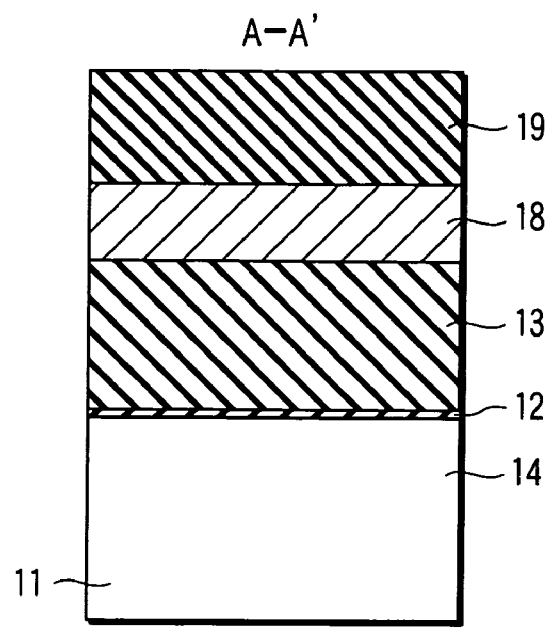
FIG. 15A  FIG. 15B
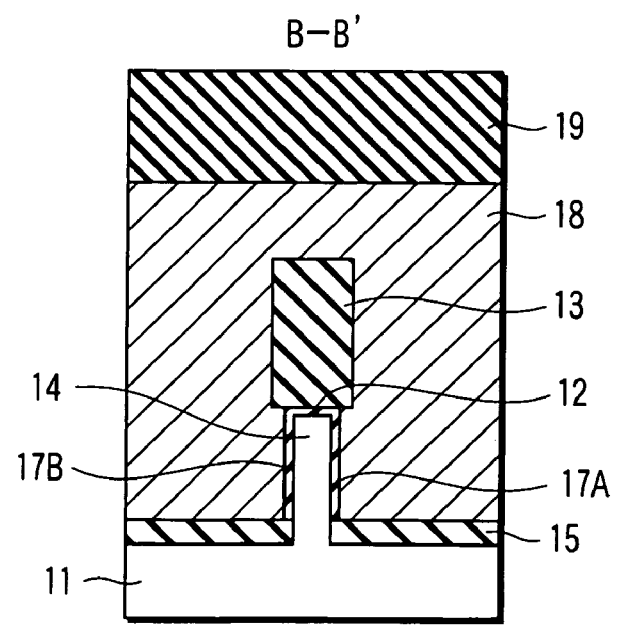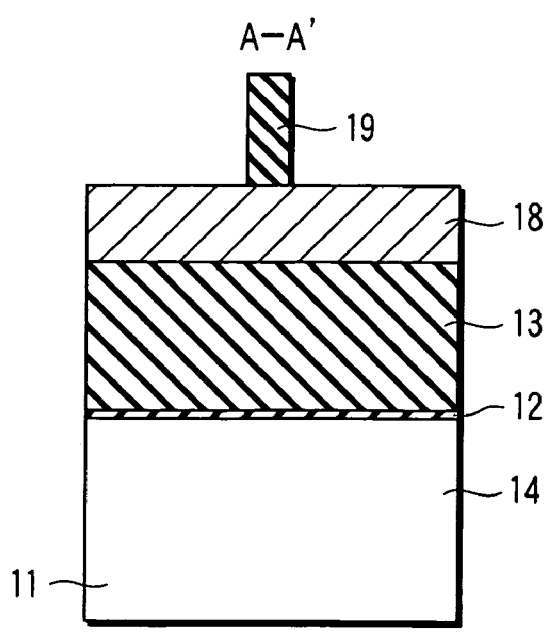
FIG. 16A  FIG. 16B

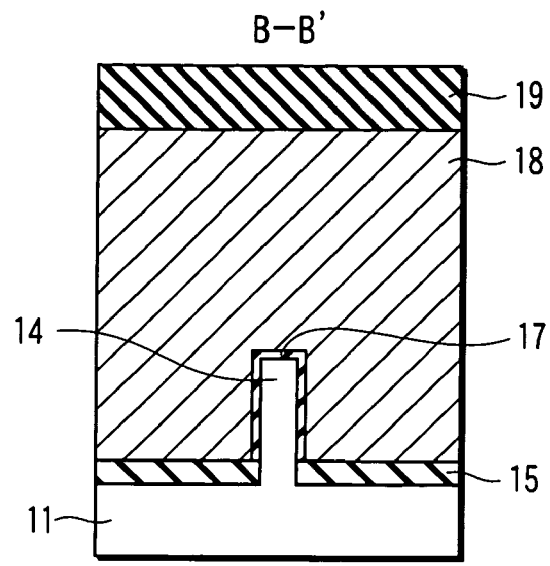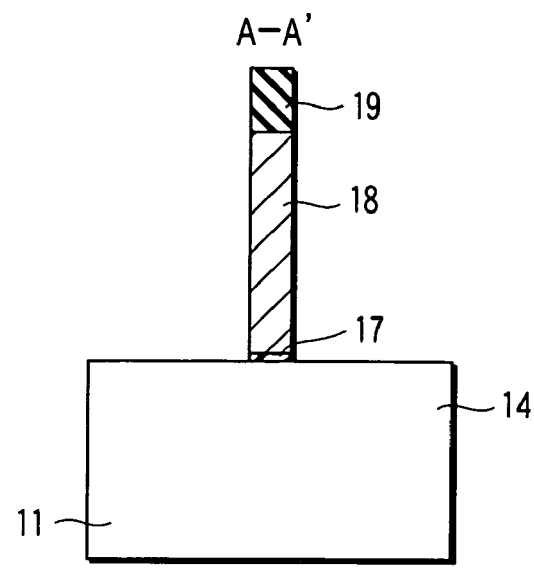
FIG. 33A  FIG. 33B
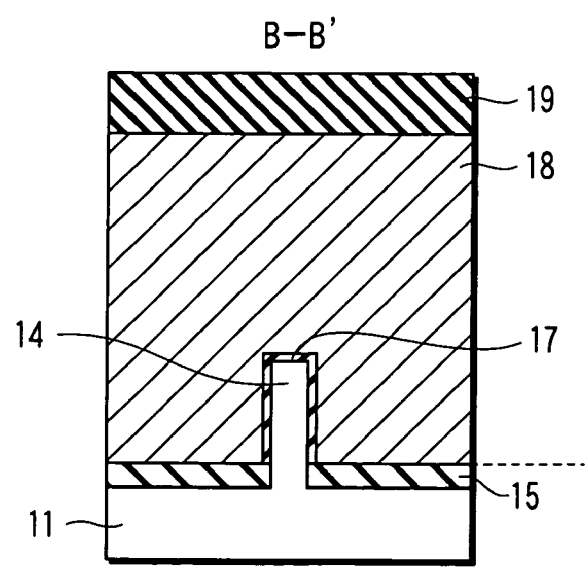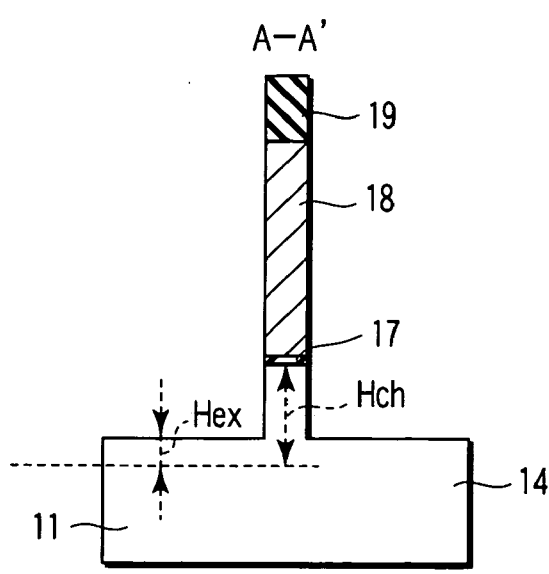
FIG. 34A  FIG. 34B

SEMICONDUCTOR DEVICE HAVING A FIN AND METHOD OF MANUFACTURING THE SAME

CROSS-REFERENCE TO RELATED APPLICATIONS

This application is based upon and claims the benefit of priority from prior Japanese Patent Application No. 2006-012278, filed Jan. 20, 2006, the entire contents of which are incorporated herein by reference.

BACKGROUND OF THE INVENTION

1. Field of the Invention

The present invention relates generally to a structure of a semiconductor device and a method of manufacturing the same, and more particularly to a semiconductor device including a MOSFET (Metal Oxide Semiconductor Field Effect Transistor) having a Fin channel and a method of manufacturing the same.

2. Description of the Related Art

There has been proposed a Fin-type MOSFET (Fin-FET) which is designed to maintain a current driving ability in a MOSFET with a fine structure. The Fin-FET is a multi-gate MOSFET with a three-dimensional structure, which can be fabricated only from an upward direction of a substrate of the Fin-FET.

The Fin-FET has a projection-shaped semiconductor layer (Fin) on the substrate, and both side surfaces of the Fin are used as channel regions. Suppression of an off-leak current that flows through the Fin, that is, punch-through, is a very important task in order to prevent degradation in cut-off characteristics. Related techniques on the Fin-FET have already been disclosed (see, for instance, Masaki Kondo et al., "A FinFET Design Based on Three-Dimensional Process and Device Simulations", Toshiba Corporation, IEEE, 2003).

BRIEF SUMMARY OF THE INVENTION

According to an aspect of the invention, there is provided a semiconductor device comprising: a Fin which is formed on a major surface of a semiconductor substrate and extends in a first direction; a source region and a drain region which are formed at both end portions in the first direction of the Fin; a first extension region which is formed between the source region and the drain region within the Fin in contact with the source region, the first extension region having a lower impurity concentration than the source region; a second extension region which is formed between the source region and the drain region within the Fin in contact with the drain region, the second extension region having a lower impurity concentration than the drain region; a channel region which is located between the first extension region and the second extension region within the Fin, a height of the Fin of the channel region being greater than a height of the Fin of each of the first extension region and the second extension region; an insulation film which covers both side surfaces and an upper surface of the channel region; and a gate electrode which covers the channel region via the insulation film.

According to another aspect of the present invention, there is provided a method of manufacturing a semiconductor device, comprising: etching a major surface of a semiconductor substrate by masking a part of the major surface of the semiconductor substrate, thus forming a Fin with a mask layer covering an upper surface of at least a channel region within the Fin, the Fin extending in a first direction; forming an insulation film such that the insulation film covers both side surfaces of the channel region; forming a gate electrode material such that the gate electrode material covers both side surfaces of the channel region via the insulation film and the mask layer; forming a hard mask on an upper surface of the gate electrode material, the hard mask covering the channel region in a direction crossing the first direction of the Fin; performing etching using the hard mask as a mask, thereby forming a gate electrode, and decreasing a height of the Fin in a region excluding the channel region; forming first spacers on both side surfaces in the first direction of the gate electrode, and doping impurities in the Fin using the first spacers as a mask, thereby forming a first extension region and a second extension region; and forming second spacers on both side surfaces in the first direction of the first spacers, doping impurities using the second spacers as a mask with a higher impurity concentration than in the first and second extension regions, thereby forming a source region and a drain region at both end portions in the first direction of the Fin, the source region and the drain region sandwiching the channel region and the first and second extension regions.

According to still another aspect of the present invention, there is provided a method of manufacturing a semiconductor device, comprising: etching a major surface of a semiconductor substrate by masking a part of the major surface of the semiconductor substrate, thus forming a Fin which extends in a first direction; forming an insulation film such that the insulation film covers both side surfaces and an upper surface of a channel region within the Fin; forming a gate electrode material on the Fin such that the gate electrode material covers both side surfaces and the upper surface of the channel region via the insulation film; forming a hard mask on an upper surface of the gate electrode material, the hard mask covering the channel region in a direction crossing the first direction of the Fin; performing etching using the hard mask as a mask, thereby forming a gate electrode, and decreasing a height of the Fin in a region excluding the channel region; forming first spacers on both side surfaces in the first direction of the gate electrode, and doping impurities in the Fin using the first spacers as a mask, thereby forming a first extension region and a second extension region; and forming second spacers on both side surfaces in the first direction of the first spacers, doping impurities using the second spacers as a mask with a higher impurity concentration than in the first and second extension regions, thereby forming a source region and a drain region at both end portions in the first direction of the Fin, the source region and the drain region sandwiching the channel region and the first and second extension regions.

BRIEF DESCRIPTION OF THE SEVERAL VIEWS OF THE DRAWING

FIG. 15A is a cross-sectional view taken along line B-B', illustrating a fabrication step of the semiconductor device, which follows the step illustrated in FIG. 14, and FIG. 15B is a cross-sectional view taken along line A-A';

FIG. 16A is a cross-sectional view taken along line B-B', illustrating a fabrication step of the semiconductor device, which follows the step illustrated in FIG. 15A and 15B, and FIG. 16B is a cross-sectional view taken along line A-A';

FIG. 33A is a cross-sectional view taken along line B-B', illustrating a fabrication step of the semiconductor device, which follows the step illustrated in FIG. 32A and 32B, and FIG. 33B is a cross-sectional view taken along line A-A';

FIG. 34A is a cross-sectional view taken along line B-B', illustrating a fabrication step of the semiconductor device, which follows the step illustrated in FIG. 33A and 33B, and FIG. 34B is a cross-sectional view taken along line A-A';

DETAILED DESCRIPTION OF THE INVENTION

Figure 1:
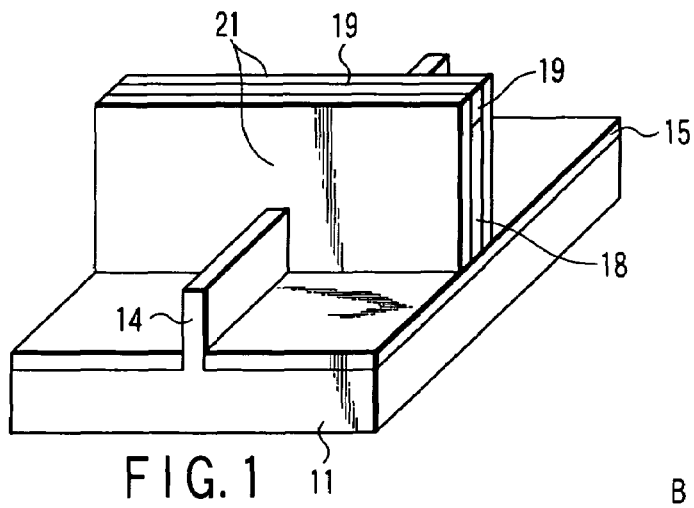
FIG. 1 is a perspective view showing a main part of a semiconductor device according to a first embodiment of the present invention.

Embodiments of the present invention will now be described in detail with reference to the accompanying drawings. In the description below, elements with the same functions and structures are denoted by like reference numerals.

FIRST EMBODIMENT

Figure 2:
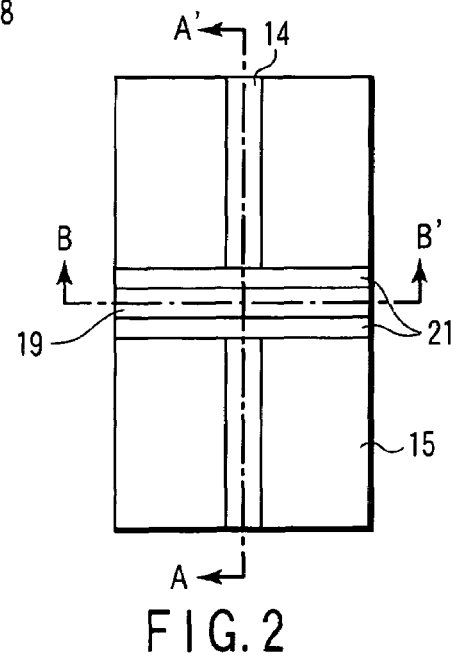
FIG. 2 is a plan view of the semiconductor device according to the first embodiment of the invention shown in FIG. 1.
Figure 3A:
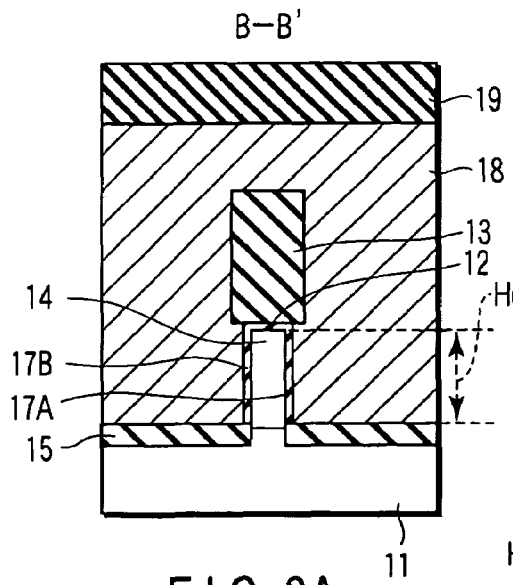
FIG. 3A is a cross-sectional view of the semiconductor device of the first embodiment, taken along line B-B' in FIG. 2.

FIG. 1 is a perspective view showing a main part of a semiconductor device according to a first embodiment of the present invention. FIG. 2 is a plan view of the semiconductor device shown in FIG. 1. FIG. 3A is a cross-sectional view taken along line B-B' in FIG. 2, and FIG. 3B is a cross-sectional view taken along line A-A' in FIG. 2.

A projection-shaped semiconductor layer, or a Fin 14, is provided on a semiconductor substrate 11 shown in FIG. 1. A device isolation region (STI: Shallow Trench Isolation) 15, which effects electrical isolation from other devices, is provided on the semiconductor substrate 11 so as to cover lower side surfaces of the Fin 14.

Figure 3B:
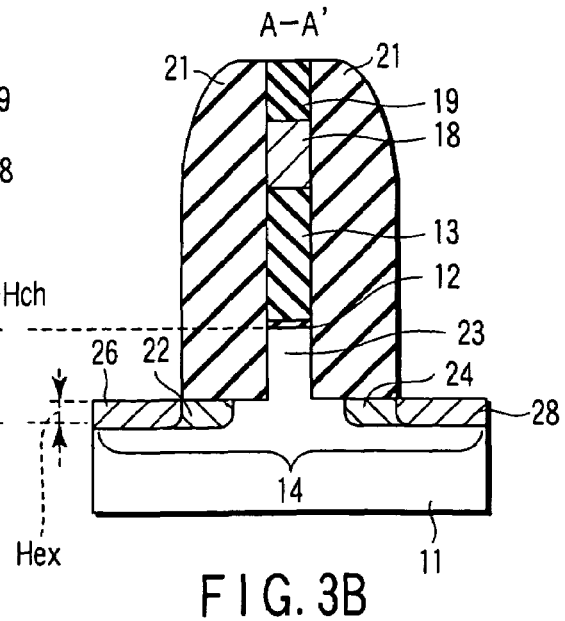
FIG. 3B is a cross-sectional view taken along line A-A' in FIG. 2.

FIG. 3B shows that a source region 26, a first extension region 22, a channel region 23, a second extension region 24 and a drain region 28 are formed in the named order in the Fin 14 in a first direction in which the Fin 14 extends along line A-A' in FIG. 2. The channel region 23 is located between the first extension region 22 and second extension region 24, and is present under an area where the Fin 14 is covered with a mask layer 19, which is formed of an insulator, in FIG. 2.

As shown in FIG. 3A, gate insulation films 17A and 17B, which are formed of, e.g. $SiO_2$, are provided on both side surfaces of the channel region 23 of the Fin 14. An insulation film 12 of, e.g. $SiO_2$ is provided on an upper surface of the channel region 23 of the Fin 14. A mask layer 13 of an insulator, e.g. SiN, is provided on the insulation film 12.

Also as shown in FIG. 3A, a gate electrode 18 is provided so as to cover both side surfaces of the channel region 23 of the Fin 14 and the mask layer 13 that is provided on the channel region 23 of the Fin 14. The gate electrode 18 is formed of, e.g. polysilicon. By the presence of the mask layer 13, the gate electrode 18 functions only at both side surfaces of the channel region 23 of the Fin 14. That is, a double-gate structure is formed. In this manner, a double-gate Fin-MOSFET (hereinafter referred to as Fin-FET) is fabricated.

As is shown in FIG. 3B, in the Fin-FET of this embodiment, the height of the channel region 23 (in the direction vertical to the surface of the substrate) which is present under the insulation film 12 is greater than the height of the neighboring first extension region 22 and second extension region 24.

Specifically, the height of the Fin 14 from its bottom to its top, that is, the height from the boundary plane between the STI 15 and gate electrode 18 to the top of the Fin in FIG. 3A, is defined as the height of the Fin. As is shown in FIG. 3B, the relationship, $H_{ch} > H_{ex}$, is established, where $H_{ch}$ is the height of the Fin of the channel region 23, and $H_{ex}$ is the height of the first and second extension regions 22 and 24.

Next, a method of manufacturing the semiconductor device according to the first embodiment of the invention is described with reference to FIG. 4 to FIG. 20. FIG. 4 to FIG. 14 (except FIG. 6) are cross-sectional views taken along line B-B' in FIG. 2. FIG. 15A to FIG. 19A and FIG. 21A are cross-sectional views taken along line B-B' in FIG. 2. FIG. 15B to FIG. 19B and FIG. 21B are cross-sectional views taken along line A-A' in FIG. 2. FIG. 20 and FIG. 22 are cross-sectional views taken along line B-B' in FIG. 2.

Figure 4:
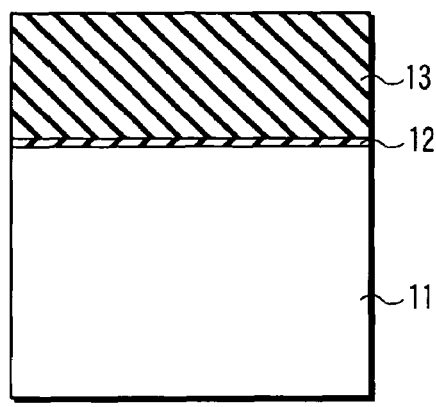
FIG. 4 is a cross-sectional view taken along line B-B', illustrating a fabrication step of the semiconductor device of the first embodiment of the invention.

To begin with, a semiconductor substrate 11 is prepared. In this example, a bulk Si substrate is used as the semiconductor substrate 11. Then, as shown in FIG. 4, an insulation film 12 (e.g. $SiO_2$) and a mask layer 13 of an insulator (e.g. SiN) are successively stacked on the semiconductor substrate 11 by, e.g. CVD (Chemical Vapor Deposition).

Figure 5:
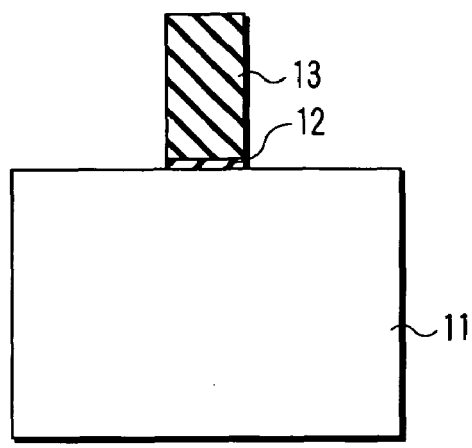
FIG. 5 is a cross-sectional view taken along line B-B', illustrating a fabrication step of the semiconductor device, which follows the step illustrated in FIG. 4.
Figure 6:
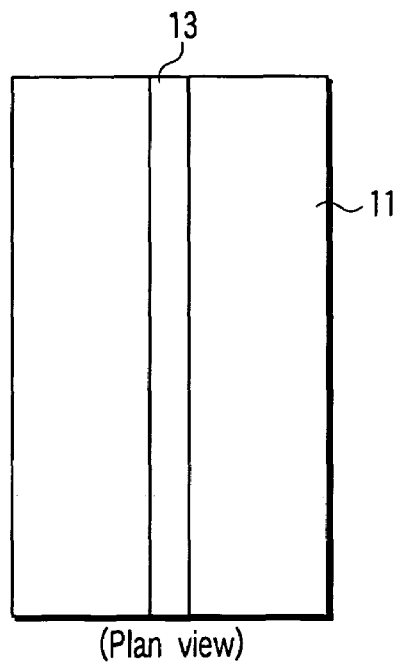
FIG. 6 is a plan view illustrating the fabrication step of the semiconductor device shown in FIG. 5.

Subsequently, as shown in FIG. 5, the insulation film 12 and mask layer 13 are etched by lithography and RIE (Reactive Ion Etching) so as to have the same plan-view pattern as a Fin which is to be described later. The plan-view pattern in this case is as shown in FIG. 6 (plan view).

Figure 7:
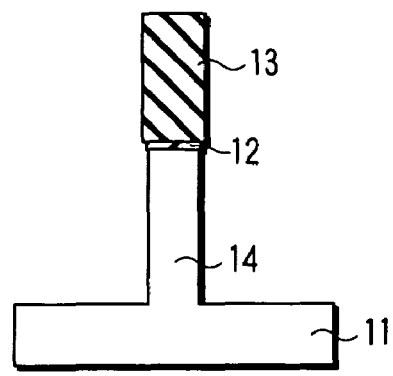
FIG. 7 is a cross-sectional view taken along line B-B', illustrating a fabrication step of the semiconductor device, which follows the step illustrated in FIG. 5.

As shown in FIG. 7, using the mask layer 13 as a mask, the major surface of the semiconductor substrate 11 is etched down to a desired depth by means of, e.g. RIE. Thereby, a Fin 14, which is a projection-shaped semiconductor layer, is formed on the major surface of the semiconductor substrate 11.

Figure 8:
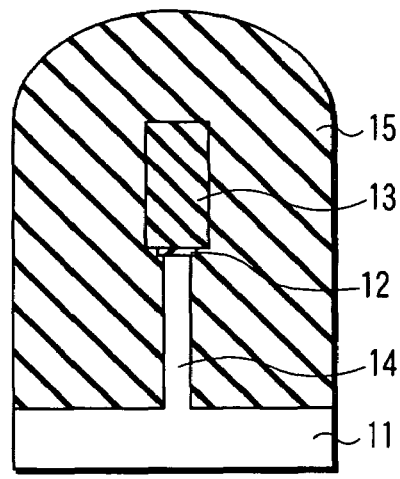
FIG. 8 is a cross-sectional view taken along line B-B', illustrating a fabrication step of the semiconductor device, which follows the step illustrated in FIG. 7.
Figure 9:
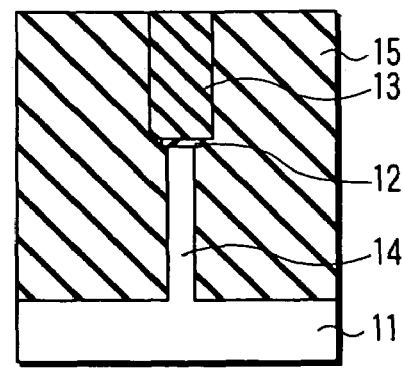
FIG. 9 is a cross-sectional view taken along line B-B', illustrating a fabrication step of the semiconductor device, which follows the step illustrated in FIG. 8.

Next, as shown in FIG. 8, an insulation layer 15 is deposited by, e.g. CVD, so as to cover the mask layer 13 over the semiconductor substrate 11. As the insulation layer 15, SiN, $SiO_2$, TEOS (Tetra-Ethyl-Ortho-Silicate), etc. is used. The insulation layer 15 is polished, as shown in FIG. 9, by CMP (Chemical Mechanical Polishing) down to a level of the surface of the mask layer 13, and thus the surface of the insulation layer 15 is planarized.

Figure 10:
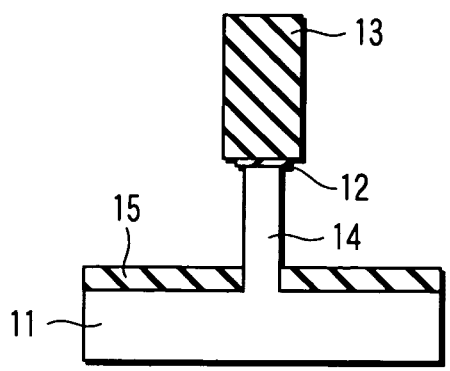
FIG. 10 is a cross-sectional view taken along line B-B', illustrating a fabrication step of the semiconductor device, which follows the step illustrated in FIG. 9.

Subsequently, as shown in FIG. 10, the insulation film 15 is etched by RIE so as to have a desired height (or thickness). This height is set to be lower than the top of the Fin 14 (Fin top). Thus, a device isolation region (STI) 15 is formed on the semiconductor substrate 11.

Figure 11:
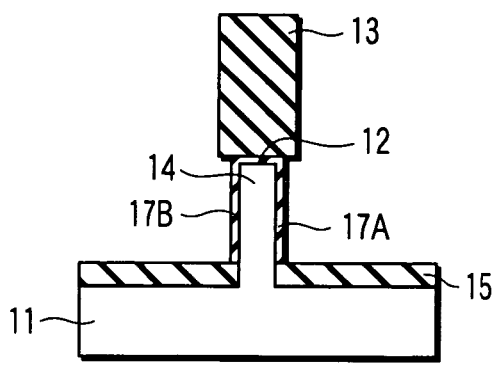
FIG. 11 is a cross-sectional view taken along line B-B', illustrating a fabrication step of the semiconductor device, which follows the step illustrated in FIG. 10.
Figure 12:
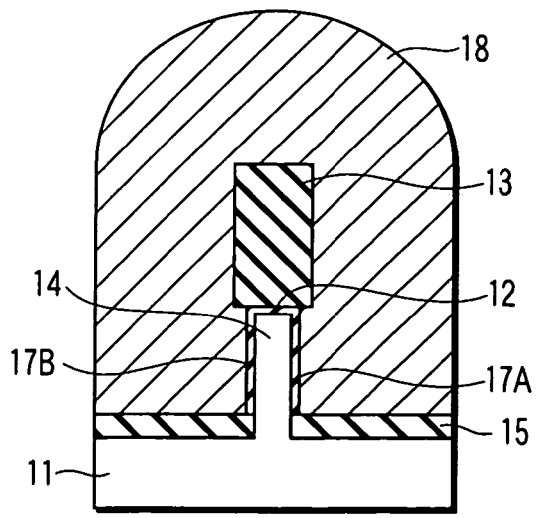
FIG. 12 is a cross-sectional view taken along line B-B', illustrating a fabrication step of the semiconductor device, which follows the step illustrated in FIG. 11.

Thereafter, as shown in FIG. 11, the Fin 14 is subjected to thermal oxidation, and gate insulation films 17A and 17B are formed on both side surfaces of the Fin 14. As shown in FIG. 12, using, e.g. CVD, a conductor (e.g. polysilicon) 18, which is a gate electrode material, is deposited so as to cover the mask layer 13 over the insulation film 15.

Figure 13:
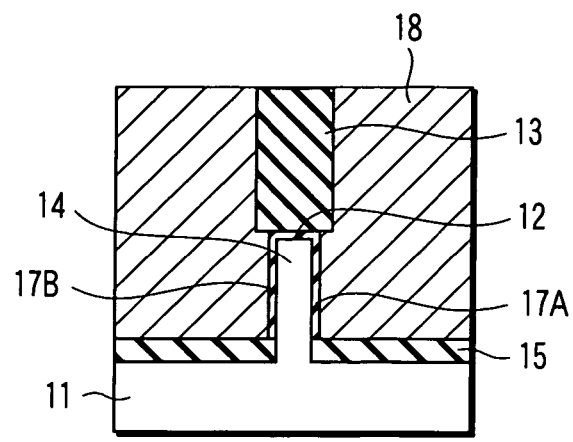
FIG. 13 is a cross-sectional view taken along line B-B', illustrating a fabrication step of the semiconductor device, which follows the step illustrated in FIG. 12.

The polysilicon layer 18, as shown in FIG. 13, is polished by CMP to the level of the surface of the mask layer 13, and thus the polysilicon layer 18 is planarized. The mask layer 13 functions as a stopper for planarizing the polysilicon layer 18 without damaging the Fin 14, and also functions to realize a double-gate structure.

Figure 14:
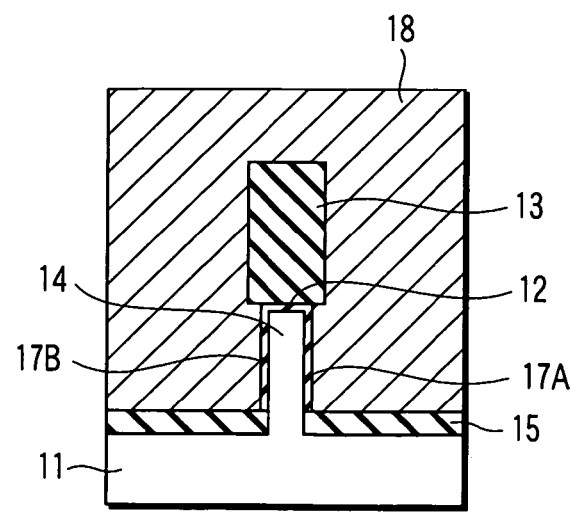
FIG. 14 is a cross-sectional view taken along line B-B', illustrating a fabrication step of the semiconductor device, which follows the step illustrated in FIG. 13.

Next, as shown in FIG. 14, polysilicon is deposited once again. In this manner, the polysilicon layer 18 with the planarized surface is formed.

As shown in FIG. 15, an insulation layer 19 (e.g. SiN) is deposited on the polysilicon layer 18. Using lithography, a mask (not shown) having a plan-view pattern of the gate electrode is formed on the insulation layer 19.

Using this mask, as shown in FIG. 16B, the insulation layer 19 is etched by, e.g. RIE down to the surface of the polysilicon layer 18. A hard mask 19 of, e.g. SiN is thus formed on the polysilicon layer 18.

Figure 17A:
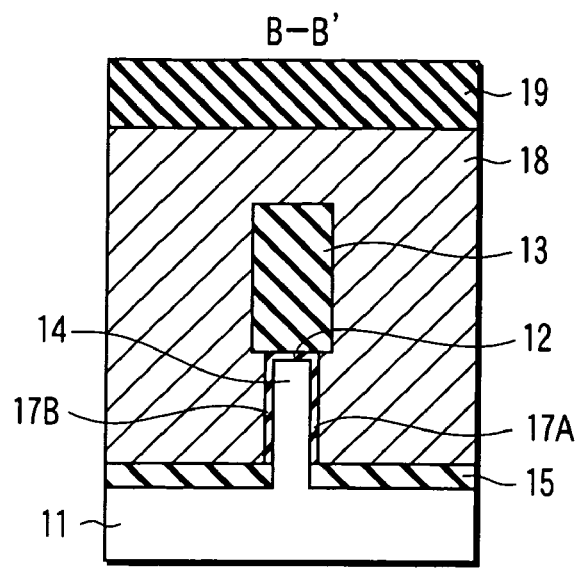
FIG. 17A is a cross-sectional view taken along line B-B', illustrating a fabrication step of the semiconductor device, which follows the step illustrated in FIG. 16A and 16B.
Figure 17B:
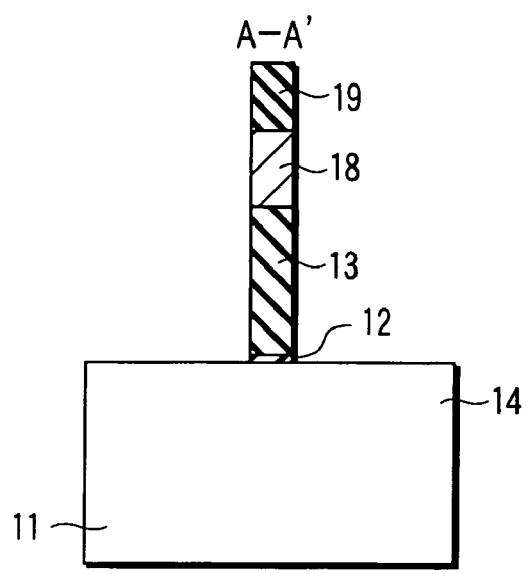
FIG. 17B is a cross-sectional view taken along line A-A'.

Subsequently, as shown in FIG. 17B, using the hard mask 19 as a mask, the polysilicon layer 18 and mask layer 13 are etched. In this case, that part of the insulation film 12 on the upper surface of the Fin 14, which is other than the part under the hard mask 19, is removed. In this manner, the gate electrode 18 of the double-gate structure is formed on both side surfaces of the channel region 23 of the Fin 14.

Figure 18A:
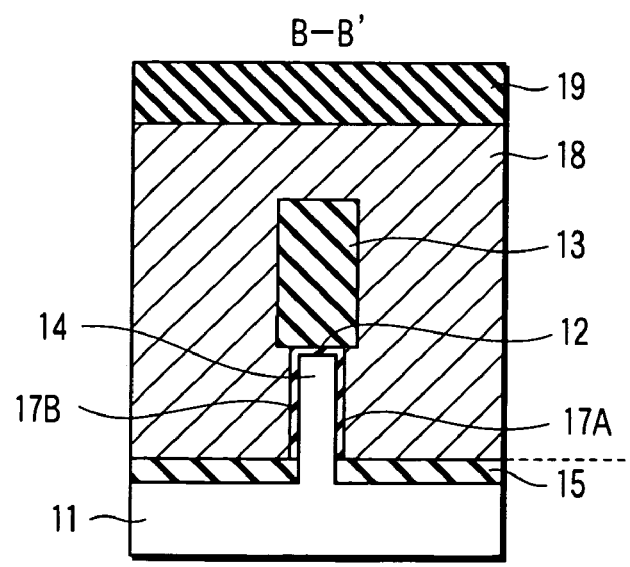
FIG. 18A is a cross-sectional view taken along line B-B', illustrating a fabrication step of the semiconductor device, which follows the step illustrated in FIG. 17A and 17B.
Figure 18B:
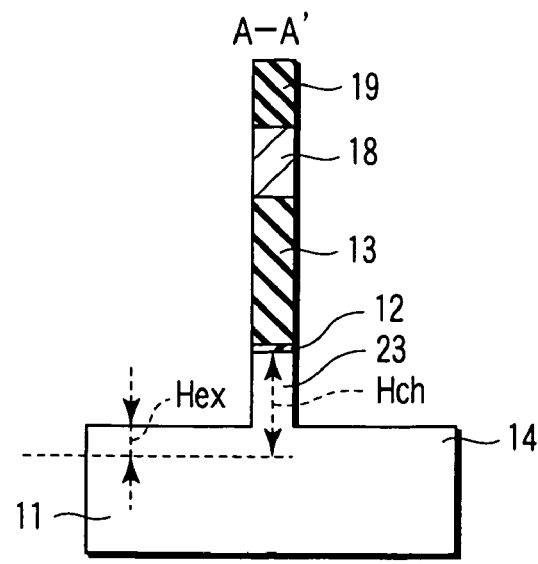
FIG. 18B is a cross-sectional view taken along line A-A'.

Further, as shown in FIG. 18B, over-etching is performed at the time of the above-described etching, or anisotropic etching is conducted on the Fin 14 from which the insulation film has been removed. Thereby, stepped parts are formed so as to make the height ($H_{ex}$) of the Fin of first and second extension regions, which are to be formed subsequently, less than the height ($H_{ch}$) of the channel region 23.

Figure 19A:
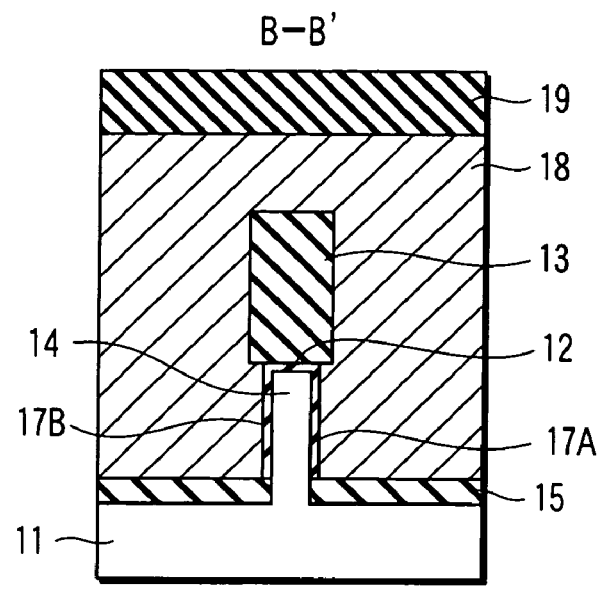
FIG. 19A is a cross-sectional view taken along line B-B', illustrating a fabrication step of the semiconductor device, which follows the step illustrated in FIG. 18A and 18B.
Figure 19B:
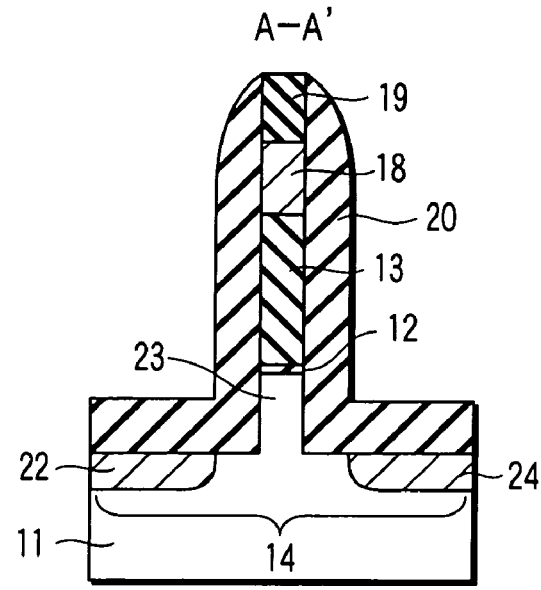
FIG. 19B is a cross-sectional view taken along line A-A'.
Figure 20:
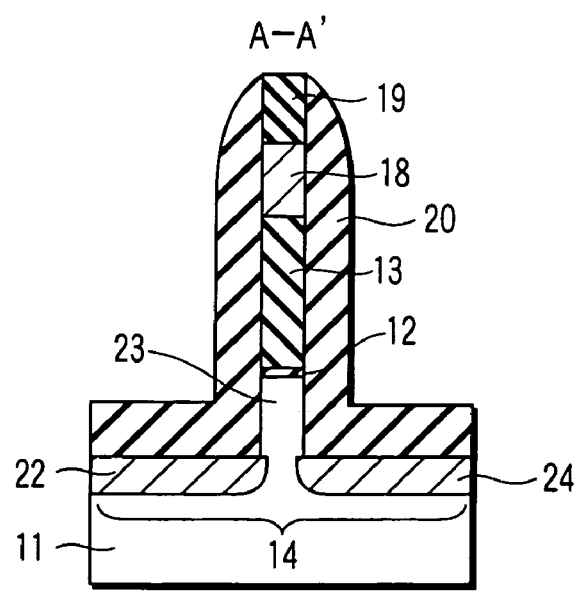
FIG. 20 is a cross-sectional view taken along line A-A', illustrating a fabrication step of the semiconductor device, which follows the step illustrated in FIG. 19A and 19B.

As shown in FIG. 19B, using, e.g. CVD and RIE, first spacers (offset spacers) 20 of, e.g. SiN are formed on both side surfaces of the gate electrode 18 (i.e. side surfaces extending in the direction of extension of the Fin 14, that is, the direction of line A-A' in FIG. 2).

The first spacers 20 are used in order to form extension regions. Using the first spacers 20 as a mask, low-concentration impurities are ion-implanted in the Fin 14. Thereby, a first extension region 22 and a second extension region 24 are formed in the Fin 14.

The impurity concentration in the first extension region 22 and second extension region 24 is set to be lower than that in source and drain regions which are to be formed subsequently. The first extension region 22 and second extension region 24 are provided to decrease electric field intensity in the channel region 23. The provision of the first extension region 22 and second extension region 24 can suppress a short-channel effect of the transistor and can enhance a current driving ability.

In usual cases, the ion implantation of impurities is followed by heat treatment such as anneal. As a result, in general, impurities are diffused and widely distributed. Thus, as shown in FIG. 20, the first extension region 22 and second extension region 24 may diffuse into the channel region 23.

Figure 21A:
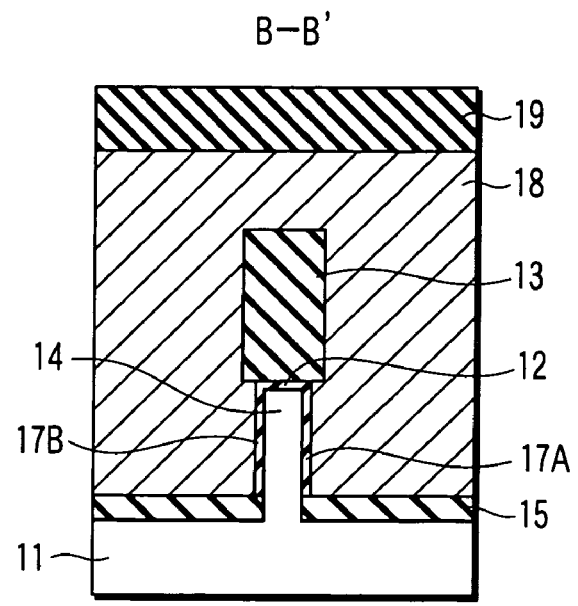
FIG. 21A is a cross-sectional view taken along line B-B', illustrating a fabrication step of the semiconductor device, which follows the step illustrated in FIG. 19A and 19B.
Figure 21B:
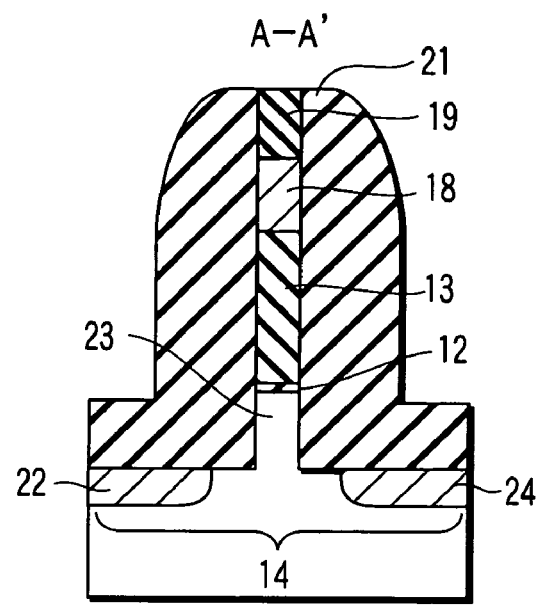
FIG. 21B is a cross-sectional view taken along line A-A'.
Figure 22:
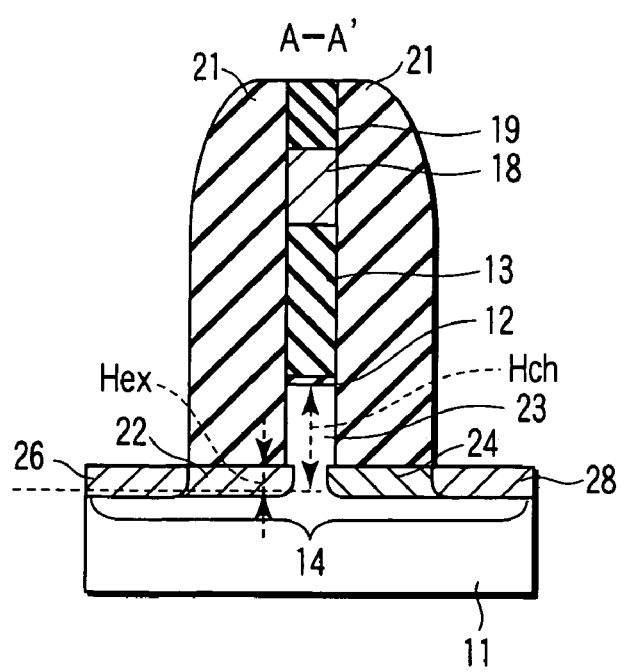
FIG. 22 is a cross-sectional view taken along line A-A', showing another semiconductor device according to the first embodiment of the invention.

Following the step in FIG. 19B, as shown in FIG. 21B, second spacers 21 of, e.g. SiN are formed by, e.g. CVD and RIE on both side surfaces of the gate electrode 18 (i.e. both side surfaces of the first spacers 20).

If the SiN, for example, which is deposited on both ends of the Fin 14 in the direction of A-A' (i.e. direction of extension of Fin 14) at the time of formation of the first spacers 20 and second spacers 21, is etched by RIE, the structure as shown in FIG. 3B is obtained. At last, using the second spacers 21 as a mask, ion implantation is performed at both ends of the Fin 14, and thus a source region 26 and a drain region 28 are formed. The impurity concentration in the source region 26 and drain region 28 is set to be higher than that in the first extension region 22 and second extension region 24. FIG. 22 is a cross-sectional view taken along line B-B' of a semiconductor device according to the present embodiment in a case where the first extension region 22 and second extension region 24 diffuse into the channel region 23, as shown in FIG. 20.

In the case of a Fin-FET with a conventional structure wherein the height of the Fin of the channel region 23 is equal to the height of the first extension region 22 and second extension region 24, an off-leak current, which flows through the Fin, mainly flows at a Fin top of the Fin. In the present embodiment, however, the height of the channel region 23 is set to be greater than the height of the first extension region 22 and second extension region 24, thereby increasing a current path of a current that flows from the first extension region 22 to the second extension region 24 via the Fin top of the channel region 23. As a result, the off-leak current, i.e. punch-through, flowing through the Fin top can be reduced.

Figure 23:
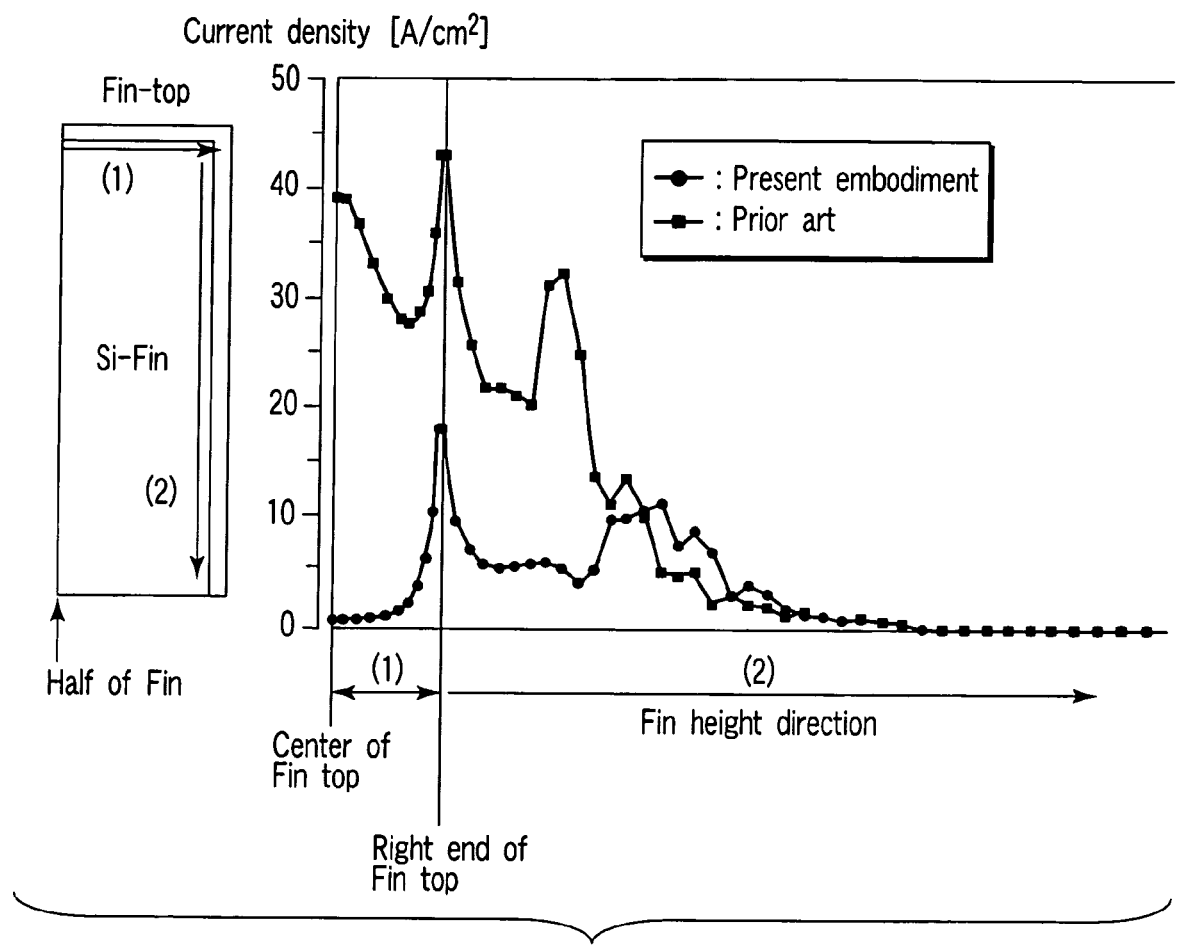
FIG. 23 is a graph showing current density distributions of off-leak current in a right half part of a Fin cross section, in a case of a Fin-FET with a conventional structure and in a case of the Fin-FET of the first embodiment of the invention.

FIG. 23 is a graph showing, by simulation, current density distributions of off-leak current in the right half part of the cross section of the Fin 14 shown in FIG. 3A, in the case of the Fin-FET with the conventional structure and in the case of the Fin-FET of the embodiment of the invention. It is assumed that the height of the Fin of the channel region is equal between the conventional structure and the structure of the embodiment ($H_{ch}$=70 nm). In the structure of the present embodiment, it is assumed that the height of the Fin of the first and second extension regions 22 and 24 is less than the height of the channel region 23 by 20 nm, that is, $H_{ch}-H_{ex}$=20 nm.

It is understood from FIG. 23 that compared to the Fin-FET of the conventional structure, the Fin-FET of the structure of the present embodiment can more effectively suppress punch-through, in particular, at the Fin top.

Figure 24:
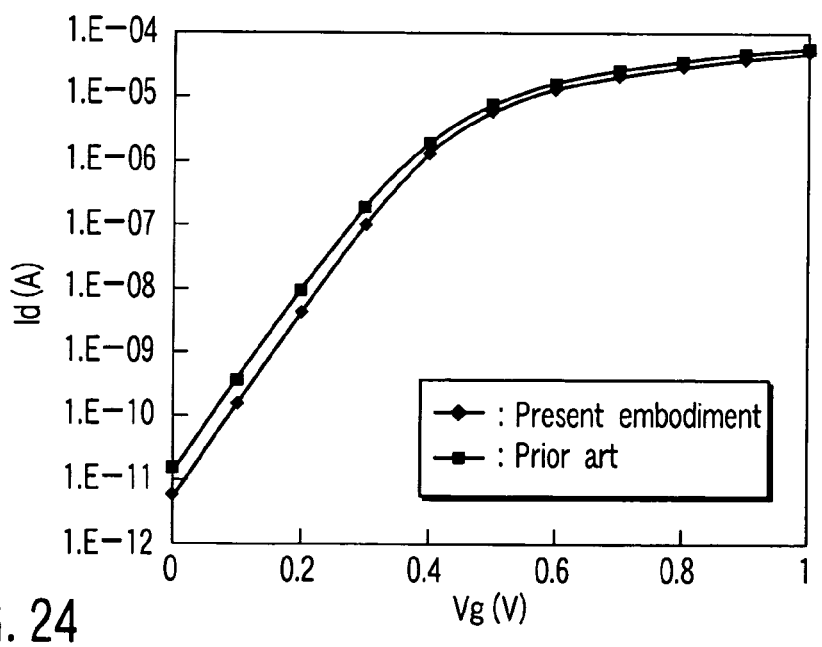
FIG. 24 is a graph showing drain current versus gate voltage characteristics in the case of the Fin-FET with the conventional structure and in the case of the Fin-FET of the first embodiment of the invention.

FIG. 24 shows drain current versus gate voltage characteristics in the case of the Fin-FET with the conventional structure and in the case of the Fin-FET of the embodiment of the invention. In this case, too, it is assumed that the height of the Fin of the channel region is equal between the conventional structure and the structure of the embodiment ($H_{ch}$=70 nm), and that in the structure of the present embodiment the height of the Fin of the first and second extension regions 22 and 24 is less than the height of the channel region 23 by 20 nm, that is, $H_{ex}$=50 nm. It is understood that with the structure of the Fin-FET of the present embodiment, an off-leak current can totally be reduced in a region below the threshold voltage.

The comparison based on the simulation demonstrates that the optimal characteristics can be obtained when the height of the Fin of the channel region is greater than the height of the Fin of the first and second extension regions by 20 nm.

Figure 25:
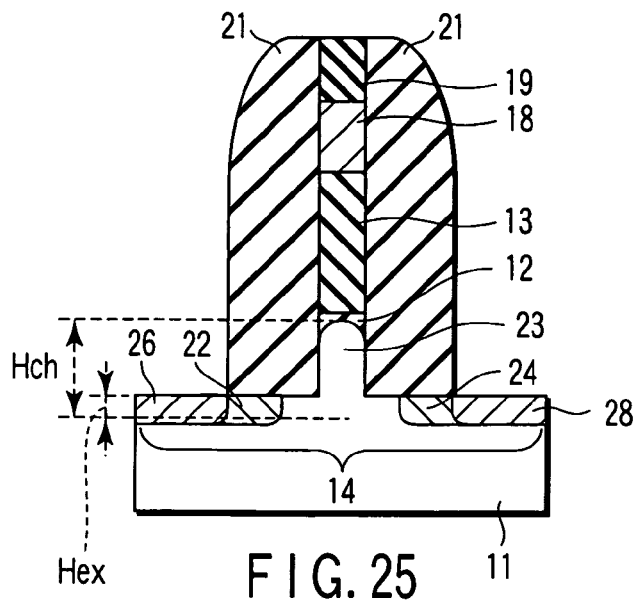
FIG. 25 is a cross-sectional view taken along line A-A', showing a Fin part of a semiconductor device according to a modification of the first embodiment of the invention.

In the present embodiment, as shown in FIG. 3B, the part of the Fin, at which the height of the Fin of the channel region 23 is greater than the height of the Fin of the first extension region 22 and second extension region 24, is represented by a projecting rectangular shape. However, as shown in FIG. 25, this part of the Fin may have a projecting shape with rounded corners, and the same advantageous effects as in the present embodiment can be obtained. Moreover, in this embodiment, the bulk Si substrate is used as the semiconductor substrate 11. Alternatively, an SOI (Silicon On Insulator) may be used as the substrate 11.

SECOND EMBODIMENT

Figure 26A:
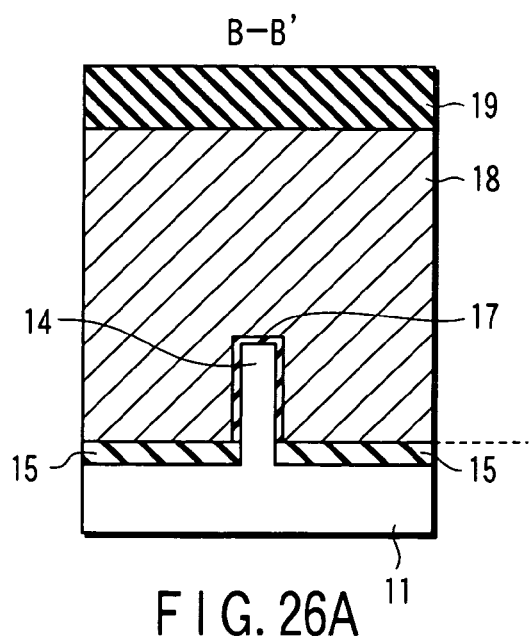
FIG. 26A is a cross-sectional view taken along line B-B', showing a semiconductor device according to a second embodiment of the present invention.

A perspective view and a plan view, which show a main part of a semiconductor device according to a second embodiment of the invention, are the same as FIG. 1 and FIG. 2. FIG. 26A is a cross-sectional view taken along line B-B' in FIG. 2, showing the semiconductor device according to the second embodiment, and FIG. 26B is a cross-sectional view taken along line A-A'.

A projection-shaped semiconductor layer, or a Fin 14, is provided on a semiconductor substrate 11 shown in FIG. 1. A device isolation region (STI: Shallow Trench Isolation) 15, which effects electrical isolation from other devices, is provided on the semiconductor substrate 11 so as to cover lower side surfaces of the Fin 14.

Figure 26B:
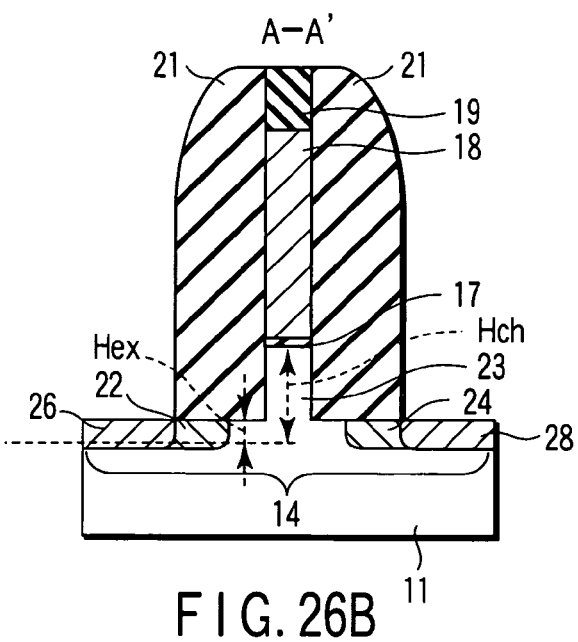
FIG. 26B is a cross-sectional view taken along line A-A'.

FIG. 26B shows that a source region 26, a first extension region 22, a channel region 23, a second extension region 24 and a drain region 28 are formed in the named order in the Fin 14 in a first direction in which the Fin 14 extends along line A-A' in FIG. 2. The channel region 23 is present under an area where the Fin 14 is covered with a mask layer 19, which is formed of an insulator, in FIG. 2.

As shown in FIG. 26A, a gate insulation film 17 of, e.g. SiO$_2$ is provided on both side surfaces and an upper surface of the channel region 23 of the Fin 14.

Also as shown in FIG. 26A, a gate electrode 18 is provided so as to cover both side surfaces and upper surface of the channel region 23 of the Fin 14. The gate electrode 18 is formed of, e.g. polysilicon. The gate electrode 18 functions at both side surfaces and upper surface of the channel region 23 of the Fin 14. That is, a tri-gate structure is formed. In this manner, a tri-gate Fin-FET is fabricated.

In this Fin-FET, the channel region 23 is present under the insulation film 17 in FIG. 26B. The bottom of the Fin 14 is positioned at the level of the boundary plane between the STI 115 and gate electrode 18 shown in FIG. 26A. In this embodiment, like the first embodiment, the height ($H_{ch}$) of the channel region 23 is set to be greater than the height ($H_{ex}$) of the neighboring first extension region 22 and second extension region 24. That is, the relationship, $H_{ch}>H_{ex}$, is established.

Next, a method of manufacturing the semiconductor device according to the second embodiment is described with reference to FIG. 27 to FIG. 36. FIG. 27 to 30 are cross-sectional views taken along line B-B' in FIG. 2. FIG. 31A to FIG. 36A are cross-sectional views taken along line B-B' in FIG. 2. FIG. 31B to FIG. 36B are cross-sectional views taken along line A-A' in FIG. 2.

Figure 27:
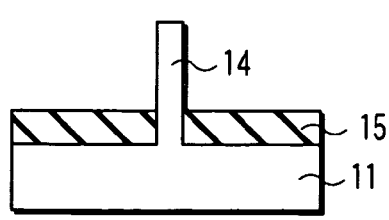
FIG. 27 is a cross-sectional view taken along line B-B', illustrating a fabrication step of the semiconductor device according to the second embodiment of the invention.

As regards the fabrication steps illustrated in FIG. 4 to FIG. 10, the manufacturing method of the semiconductor device of the second embodiment is common to that of the first embodiment. Subsequently, as shown in FIG. 27, the mask layer 13 and insulation layer 12 are entirely etched away by, e.g. RIE.

Figure 28:
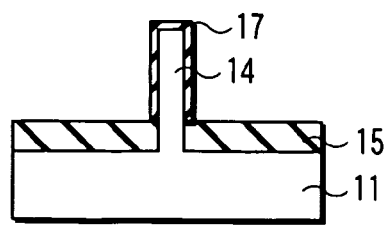
FIG. 28 is a cross-sectional view taken along line B-B', illustrating a fabrication step of the semiconductor device, which follows the step illustrated in FIG. 27.
Figure 29:
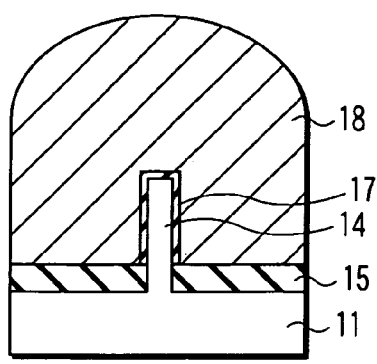
FIG. 29 is a cross-sectional view taken along line B-B', illustrating a fabrication step of the semiconductor device, which follows the step illustrated in FIG. 28.

Thereafter, as shown in FIG. 28, the Fin 14 is subjected to thermal oxidation, and a gate insulation film 17 is formed on both side surfaces and upper surface of the Fin 14. As shown in FIG. 29, a conductor (e.g. polysilicon) 18, which is a gate electrode material, is deposited so as to cover the Fin 14 over the insulation film 15.

Figure 30:
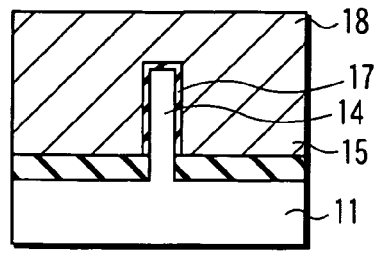
FIG. 30 is a cross-sectional view taken along line B-B', illustrating a fabrication step of the semiconductor device, which follows the step illustrated in FIG. 29.
Figure 31A:
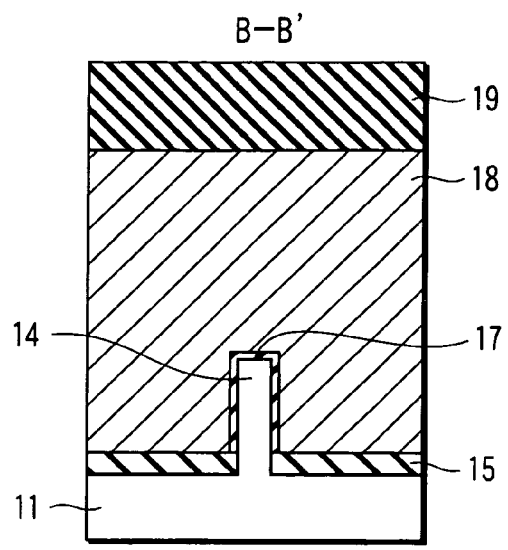
FIG. 31A is a cross-sectional view taken along line B-B', illustrating a fabrication step of the semiconductor device, which follows the step illustrated in FIG. 30.
Figure 31B:
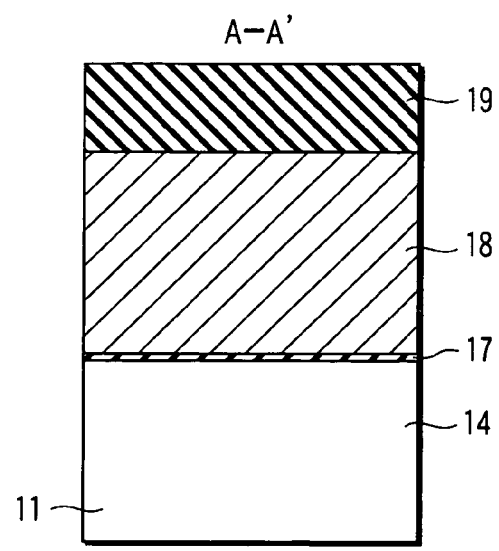
FIG. 31B is a cross-sectional view taken along line A-A'.

The surface of the polysilicon layer 18, as shown in FIG. 30, is planarized by, e.g. CMP. Then, as shown in FIG. 31, polysilicon is deposited once again and an insulation layer 19 (e.g. SiN) is deposited on the polysilicon layer 18. Using lithography, a mask (not shown) having a plan-view pattern of the gate electrode is formed on the insulation layer 19.

Figure 32A:
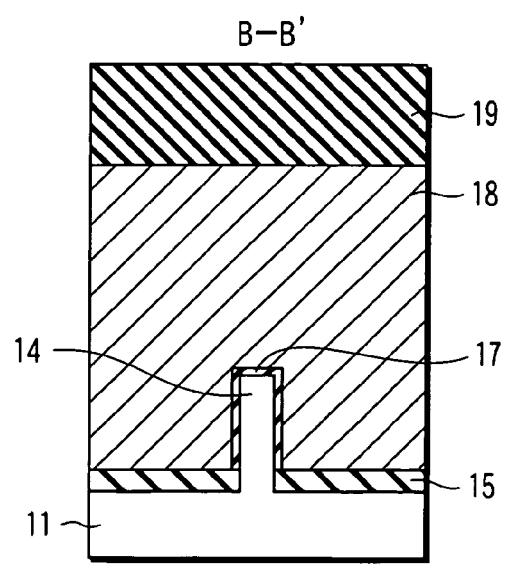
FIG. 32A is a cross-sectional view taken along line B-B', illustrating a fabrication step of the semiconductor device, which follows the step illustrated in FIG. 31A and 31B.
Figure 32B:
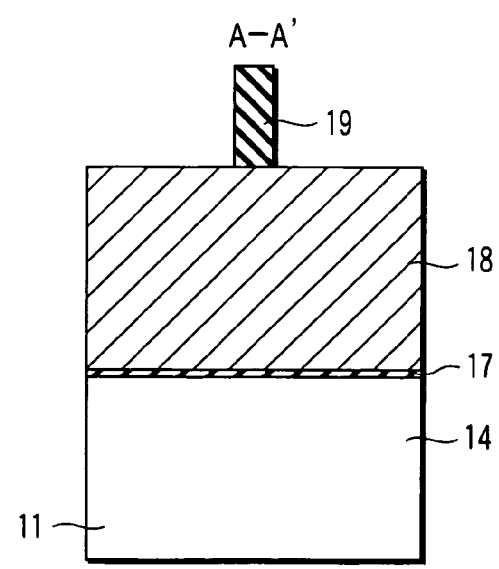
FIG. 32B is a cross-sectional view taken along line A-A'.
Figure 35A:
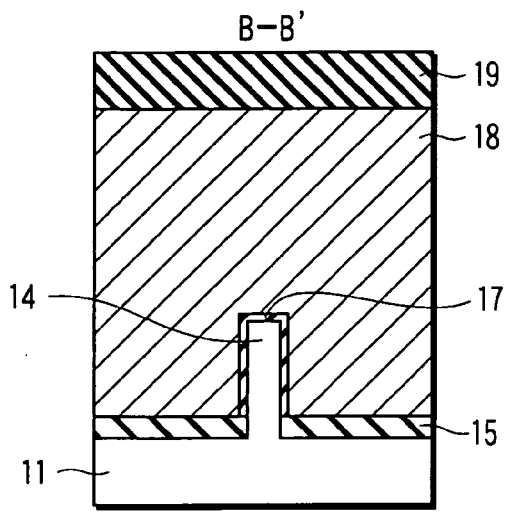
FIG. 35A is a cross-sectional view taken along line B-B', illustrating a fabrication step of the semiconductor device, which follows the step illustrated in FIG. 34A and 34B.
Figure 35B:
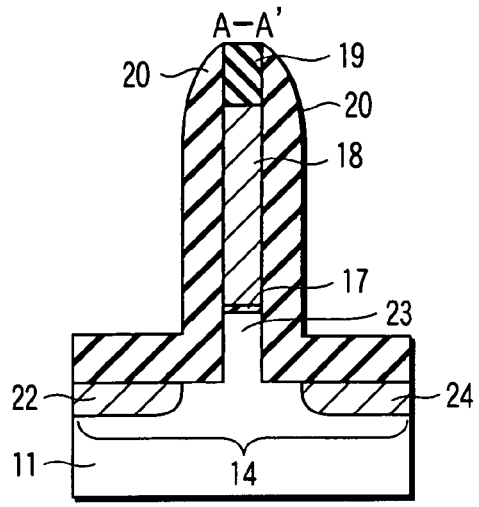
FIG. 35B is a cross-sectional view taken along line A-A'.
Figure 36A:
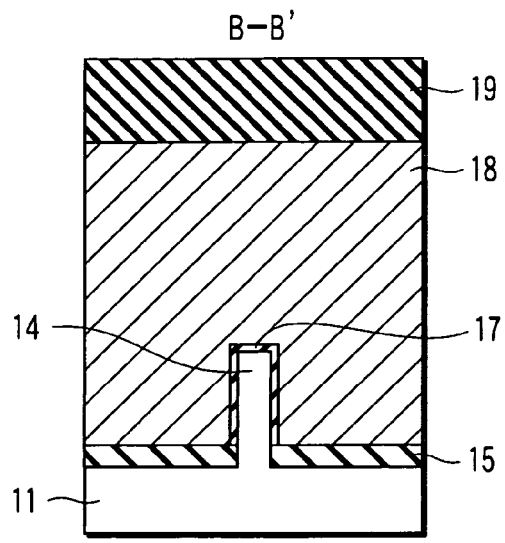
FIG. 36A is a cross-sectional view taken along line B-B', illustrating a fabrication step of the semiconductor device, which follows the step illustrated in FIG. 35A and 35B.
Figure 36B:
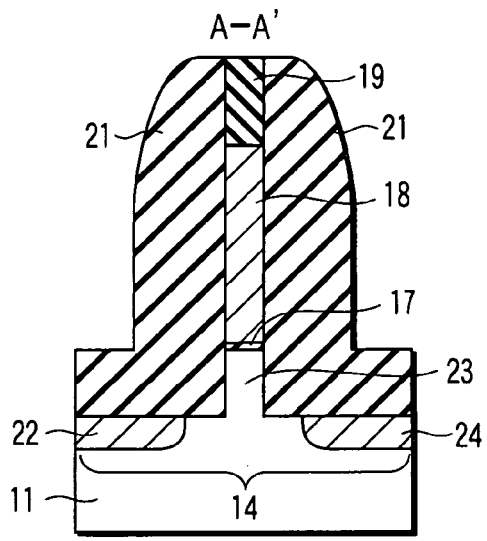
FIG. 36B is a cross-sectional view taken along line A-A'.

Using this mask, as shown in FIG. 32B, the insulation layer 19 is etched by, e.g. RIE down to the surface of the polysilicon layer 18. A hard mask 19 of, e.g. SiN is thus formed on the polysilicon layer 18.

Subsequently, as shown in FIG. 33B, using the hard mask 19 as a mask, the polysilicon layer 18 is etched by, e.g. RIE so as to have a desired plan-view pattern. In this case, that part of the insulation film 17 on the upper surface of the Fin 14, which is other than the part under the hard mask 19, is removed. In this manner, the gate electrode 18 of the tri-gate structure is formed on both side surfaces and upper surface of the channel region 23 of the Fin 14.

Figure 37:
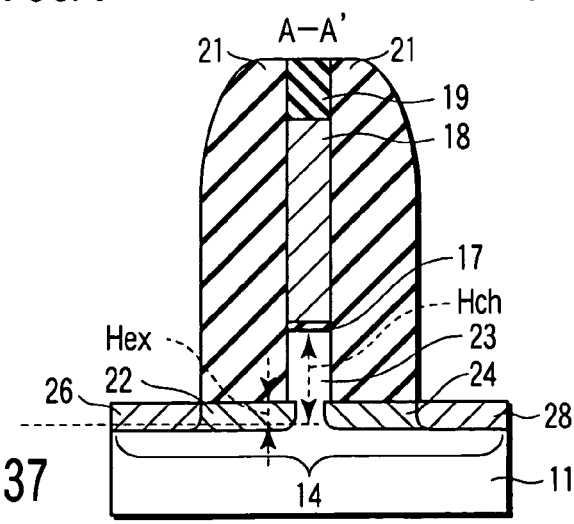
FIG. 37 is a cross-sectional view taken along line A-A', showing another semiconductor device according to the second embodiment of the invention.

Subsequent fabrication steps illustrated in FIG. 34A, 34B to FIG. 36A, 36B and FIG. 26A, 26B, which is the cross-sectional view of the semiconductor device of the second embodiment, are the same as in the first embodiment. FIG. 37 is a cross-sectional view taken along line B-B' of a semiconductor device according to the present embodiment in a case where the first extension region 22 and second extension region 24 diffuse into the channel region 23.

With the semiconductor device of the present embodiment, too, the height of the Fin of the channel region 23 is set to be greater than the height of the Fin of the first extension region 22 and second extension region 24, thereby increasing a current path of a current that flows from the first extension region 22 to the second extension region 24 via the Fin top of the channel region 23. As a result, a punch-through current flowing through the Fin top can be reduced.

In the present embodiment, too, as shown in FIG. 26B, the part of the Fin, at which the height of the Fin of the channel region 23 is greater than the height of the first extension region 22 and second extension region 24, is represented by a projecting rectangular shape. However, as shown in FIG. 25, this part of the Fin may have a projecting shape with rounded corners, and the same advantageous effects as in the present embodiment can be obtained. Moreover, in this embodiment, the bulk Si substrate is used as the semiconductor substrate 11. Alternatively, an SOI (Silicon On Insulator) may be used as the substrate 11.

One aspect of the present invention can provide a semiconductor device including a Fin-FET with suppressed punch-through, and a method of manufacturing the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a Fin which is formed on a major surface of a semiconductor substrate and extends in a first direction;
    a source region and a drain region which are formed at both end portions in the first direction of the Fin;
    a first extension region which is formed between the source region and the drain region within the Fin in contact with the source region, the first extension region having a lower impurity concentration than the source region;
    a second extension region which is formed between the source region and the drain region within the Fin in contact with the drain region, the second extension region having a lower impurity concentration than the drain region;
    a channel region which is located between the first extension region and the second extension region within the Fin, a height of the Fin of the channel region being greater than a height of the Fin of each of the first extension region and the second extension region, the Fin of the channel region including a protruding portion protruding above an upper surface of the first and second extension regions;
    an insulation film which covers both side surfaces and an upper surface of the channel region; and
    a gate electrode which covers the channel region via the insulation film.

2. The device according to claim 1, wherein the gate electrode covers both side surfaces of the channel region via the insulation film.

3. The device according to claim 1, further comprising:
    a mask layer which is formed on the upper surface of the channel region via the insulation film,
    wherein the gate electrode covers both side surfaces of the channel region via the insulation film and covers the upper surface of the channel via the insulation film and the mask layer.

4. The device according to claim 1, wherein the gate electrode covers both side surfaces and the upper surface of the channel region via the insulation film.

5. The device according to claim 1, wherein a part of the channel region, at which the height of the Fin of the channel region is greater than the height of the Fin of each of the first extension region and the second extension region, has a rectangular cross-sectional shape in the first direction.

6. The device according to claim 1, wherein the semiconductor substrate is a bulk Si substrate.

7. The device according to claim 1, wherein the semiconductor substrate is an SOI (Silicon On Insulator).

8. The device according to claim 1, further comprising:
    an insulation layer which is formed on an area of the major surface of the semiconductor substrate, where the Fin is not formed, at a level lower than a top portion of the Fin.

9. The device according to claim 1, wherein the gate electrode includes an upper surface which is planarized.

* * * * *